(12) United States Patent
Kajiwara et al.

(10) Patent No.: US 9,484,421 B2
(45) Date of Patent: Nov. 1, 2016

(54) SEMICONDUCTOR DEVICE (71) Applicant: Kabushiki Kaisha Toshiba, Minato-ku (JP)

(72) Inventors: Yosuke Kajiwara, Yokohama (JP); Kentaro Ikeda, Kawasaki (JP); Hisashi Saito, Kawasaki (JP); Masahiko Kuraguchi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/810,933

(22) Filed: Jul. 28, 2015

(65) Prior Publication Data

US 2016/0087052 A1 Mar. 24, 2016

(30) Foreign Application Priority Data

Sep. 19, 2014 (JP) .................................. 2014-192012

(51) Int. Cl.
*H01L 27/088* (2006.01)
*H01L 29/417* (2006.01)
(Continued)

(52) U.S. Cl.
CPC ..... *H01L 29/41758* (2013.01); *H01L 23/5283* (2013.01); *H01L 23/535* (2013.01); *H01L 27/0605* (2013.01); *H01L 29/0649* (2013.01); *H01L 29/0696* (2013.01); *H01L 29/2003* (2013.01); *H01L 29/7786* (2013.01); *H01L 29/7787* (2013.01); *H01L 29/78* (2013.01); *H01L 29/4175* (2013.01)

(58) Field of Classification Search
CPC ............ H01L 29/41758; H01L 29/0696; H01L 23/535; H01L 29/7787; H01L 29/0649; H01L 29/78; H01L 29/7786; H01L 27/0605; H01L 29/2003; H01L 23/5283; H01L 29/4175

See application file for complete search history.

(56) References Cited

U.S. PATENT DOCUMENTS 6,317,305 B1  11/2001  Dedic
2008/0079023 A1* 4/2008  Hikita ................. H01L 29/1066
                                                   257/192

(Continued)

FOREIGN PATENT DOCUMENTS

EP  0 940 852 A2  9/1999
JP  7-193087 A  7/1995

(Continued)

OTHER PUBLICATIONS

Extended European Search Report issued Feb. 15, 2016 in Patent Application No. 15175075.9.

*Primary Examiner* — Victor A Mandala
(74) *Attorney, Agent, or Firm* — Oblon, McClelland, Maier & Neustadt, L.L.P (57) ABSTRACT

A semiconductor device according to an embodiment includes a nitride semiconductor layer, a plurality of source electrodes provided on the nitride semiconductor layer, a plurality of drain electrodes, a plurality of gate electrodes, a first interconnection having a first distance from the nitride semiconductor layer and electrically connecting the source electrodes, a second interconnection electrically connecting the gate electrodes, and a third interconnection having a third distance from the nitride semiconductor layer and electrically connecting the drain electrodes. Each of the drain electrodes are provided between the source electrodes. Each of the gate electrodes are provided between each of the source electrodes and each of the drain electrodes. The third distance is larger than the first distance.

9 Claims, 6 Drawing Sheets (51) Int. Cl.
  *H01L 23/528* (2006.01)
  *H01L 29/778* (2006.01)
  *H01L 27/06* (2006.01)
  *H01L 29/20* (2006.01)
  *H01L 23/535* (2006.01)
  *H01L 29/06* (2006.01)
  *H01L 29/78* (2006.01)

(56) References Cited

U.S. PATENT DOCUMENTS

| | | | |
|---|---|---|---|
| 2009/0079446 A1* | 3/2009 | Chatterjee | G01R 31/2621 324/719 |
| 2010/0038687 A1* | 2/2010 | Klaus | H01L 21/31105 257/288 |
| 2011/0062527 A1* | 3/2011 | Shino | H01L 21/823814 257/369 |
| 2011/0114967 A1 | 5/2011 | Hikita et al. | |
| 2011/0241126 A1* | 10/2011 | Herberholz | H01L 29/0692 257/401 |
| 2013/0069114 A1 | 3/2013 | Simin et al. | |
| 2013/0119486 A1 | 5/2013 | Kaibara et al. | |
| 2013/0126893 A1* | 5/2013 | Tanaka | H01L 29/2003 257/76 |
| 2013/0313653 A1 | 11/2013 | Brech | |
| 2014/0092638 A1 | 4/2014 | Nishimori et al. | |
| 2014/0252368 A1* | 9/2014 | Lee | H01L 29/66462 257/76 |
| 2015/0263107 A1* | 9/2015 | Kobayashi | H01L 29/404 257/367 |

FOREIGN PATENT DOCUMENTS

| | | |
|---|---|---|
| JP | 2006-114795 A | 4/2006 |
| JP | 2006-222393 A | 8/2006 |
| JP | 2010-10489 | 1/2010 |
| JP | 2012-23074 | 2/2012 |
| JP | 2013-98222 | 5/2013 |
| JP | 2014-72379 | 4/2014 |
| WO | WO 2012/043334 A1 | 4/2012 |

\* cited by examiner

SEMICONDUCTOR DEVICE

CROSS-REFERENCE TO RELATED APPLICATION

This application is based upon and claims the benefit of priority from Japanese Patent Application No.2014-192012, filed on Sep. 19, 2014, the entire contents of which are incorporated herein by reference.

FIELD

Embodiments described herein relate generally to a semiconductor device.

BACKGROUND

Nitride-based semiconductor materials have high breakdown field strength and high electron mobility and thus are expected to be applied to power-electronics semiconductor devices, high-frequency power semiconductor devices, or the like.

In a horizontal power-electronics semiconductor device, it is preferable that a gate width be large for driving with a large current. At this time, a multi-finger structure is preferably used. Here, a horizontal power-electronics semiconductor device having a multi-finger structure has a large switching loss due to parasitic capacitance between interconnections and a substrate and thus there is a demand for a decrease in parasitic capacitance.

DETAILED DESCRIPTION

A semiconductor device according to an embodiment includes a nitride semiconductor layer; a plurality of source electrodes provided on the nitride semiconductor layer; a plurality of drain electrodes, each of the drain electrodes provided between the source electrodes; a plurality of gate electrodes, each of the gate electrodes provided between each of the source electrodes and each of the drain electrodes; a first interconnection having a first distance from the nitride semiconductor layer and electrically connecting the source electrodes; a second interconnection electrically connecting the gate electrodes; and a third interconnection having a third distance from the nitride semiconductor layer and electrically connecting the drain electrodes, the third distance being larger than the first distance.

Hereinafter, embodiments of the invention will be described with reference to the accompanying drawings.

In this specification, in order to describe positional relationships of components and the like, an upward direction in the drawings is referred to as "upper" and a downward direction in the drawings is referred to as "lower". In this specification, the concept of "upper" and "lower" does not necessarily indicate a relationship with the gravitational direction.

First Embodiment

A semiconductor device according to this embodiment includes a nitride semiconductor layer; a plurality of source electrodes provided on the nitride semiconductor layer; a plurality of drain electrodes, each of the drain electrodes provided between the source electrodes; a plurality of gate electrodes, each of the gate electrodes provided between each of the source electrodes and each of the drain electrodes; a first interconnection having a first distance from the nitride semiconductor layer and electrically connecting the source electrodes; a second interconnection electrically connecting the gate electrodes; and a third interconnection having a third distance from the nitride semiconductor layer and electrically connecting the drain electrodes, the third distance being larger than the first distance.

Figure 1:
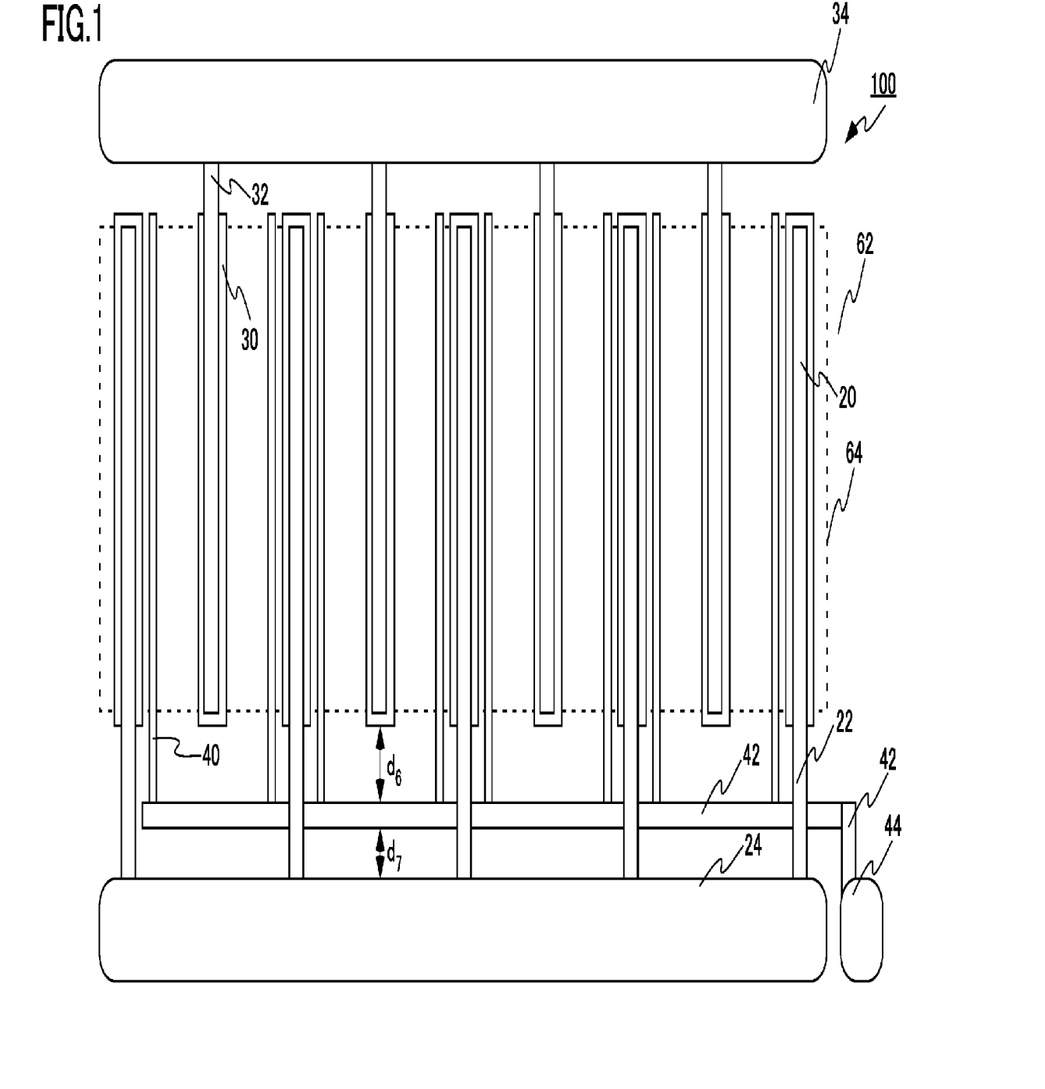
FIG. 1 is a schematic diagram illustrating a semiconductor device according to a first embodiment.
Figure 2:
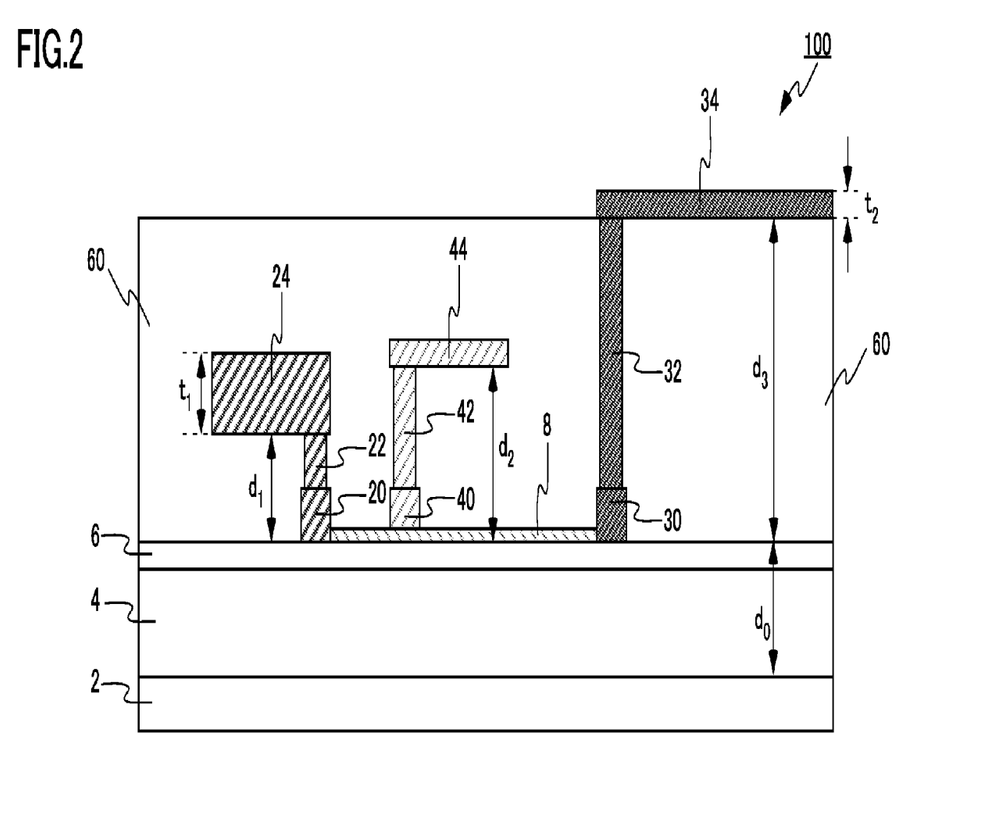
FIG. 2 is a schematic cross-sectional view of the semiconductor device according to the first embodiment.
Figure 3:
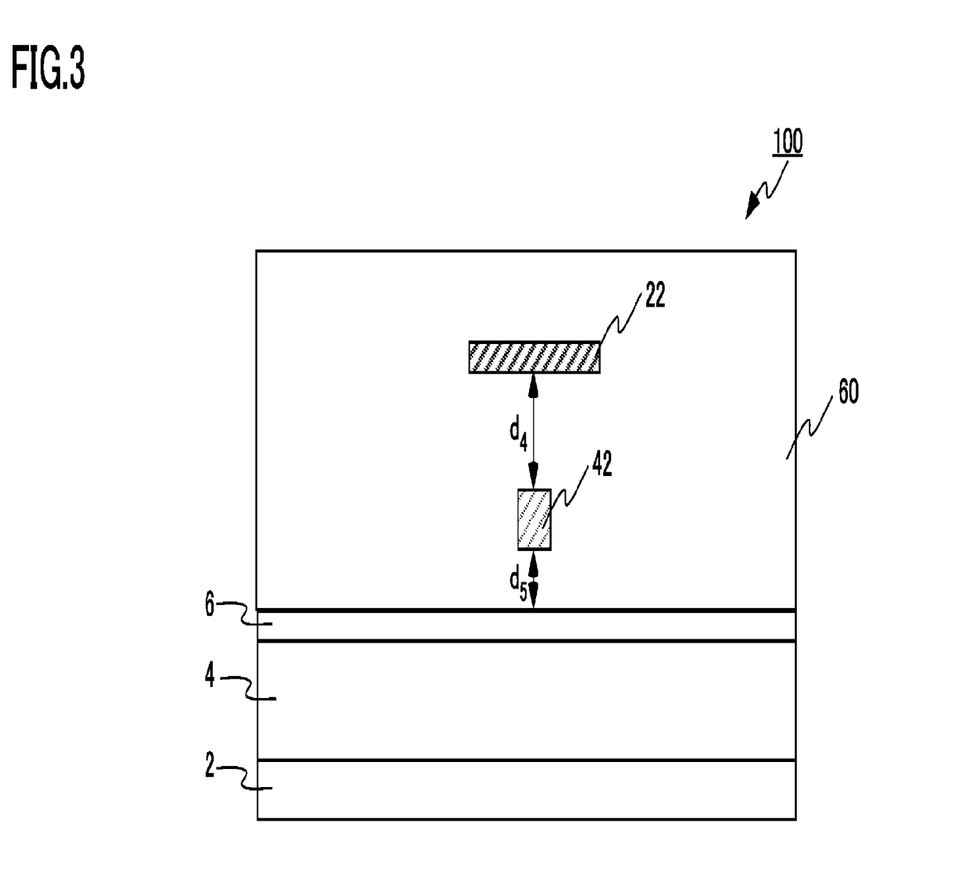
FIG. 3 is a schematic cross-sectional view of the semiconductor device according to the first embodiment.

FIG. 1 is a schematic diagram illustrating the semiconductor device according to this embodiment. FIGS. 2 and 3 are schematic cross-sectional views of the semiconductor device according to this embodiment. Here, FIG. 1 is a schematic diagram when the semiconductor device according to this embodiment illustrated in FIGS. 2 and 3 are viewed from the upper side.

The semiconductor device according to this embodiment is, for example, a high electron mobility transistor (HEMT) formed of nitride semiconductor such as gallium nitride (GaN), aluminum gallium nitride (AlGaN), or indium gallium nitride (InGaN). An electrode structure of the semiconductor device according to this embodiment is a multi-finger structure.

The semiconductor device 100 includes a substrate 2, a GaN layer 4 provided on the substrate 2, an AlGaN layer 6 provided on the GaN layer 4, and an insulating film 8 provided on the AlGaN layer 6. As the substrate 2, for example, a silicon (Si) substrate, a silicon carbide (SiC) substrate, or a sapphire substrate is preferably used. As a material of the insulating film 8, for example, silicon nitride (SiN), aluminum nitride (AlN), silicon oxide ($SiO_2$), or aluminum oxide ($Al_2O_3$) is preferably used. A buffer layer, which is not illustrated in the drawings, may be provided between the substrate 2 and the GaN layer 4.

A device isolation boundary 64 may be provided in the semiconductor device 100. At this time, a device isolation region 62 is provided on the nitride semiconductor layer outside the device isolation boundary 64. The device isolation region 62 is formed, for example, by Ar ion implantation into the nitride semiconductor layer. Alternatively, the device isolation region 62 may be formed by embedding an insulator material such as a polyimide film or a benzocyclobutene (BCB) film having a low specific dielectric constant in the nitride semiconductor layer.

The semiconductor device 100 further includes a plurality of source electrodes 20 provided on the AlGaN layer 6, a plurality of drain electrodes 30 provided on the AlGaN layer 6, and a plurality of gate electrodes 40 provided on the insulating film 8 on the AlGaN layer 6. Here, each of the drain electrodes 30 is provided between the source electrodes 20. Each of the gate electrodes 40 is provided between each of the source electrodes 20 and each of the drain electrodes 30.

A first interconnection 24 is provided on the AlGaN layer 6 and is electrically connected to the source electrodes 20.

A plurality of first connecting portions 22 are provided between the first interconnection 24 and the source electrodes 20, respectively. The first connecting portions 22 electrically connect the source electrodes 20 to the first interconnection 24. In order to relax an electric field concentration at the time of application of a voltage and to suppress a current collapse, it is preferable that the source electrodes 20 be electrically connected to the substrate 2 to have the same potential as the substrate 2. Here, when plural interconnections electrically connected to the source electrodes 20 are provided, an interconnection which can describe a largest inscribed circle in a plane parallel to the nitride semiconductor layer is defined as the first interconnection 24. The other interconnections are defined as the first connecting portions 22.

A third interconnection 34 is provided on the AlGaN layer 6 and is electrically connected to the drain electrodes 30. A plurality of third connecting portions 32 are provided between the third interconnection 34 and the drain electrodes 30, respectively. The third connecting portions 32 electrically connect the drain electrodes 30 to the third interconnection 34. Here, when plural interconnections electrically connected to the drain electrodes 30 are provided, an interconnection which can describe a largest inscribed circle in a plane parallel to the nitride semiconductor layer is defined as the third interconnection 34. The other interconnections are defined as the third connecting portions 32.

A distance $d_3$ (third distance) between the third interconnection 34 and the AlGaN layer 6 is larger than a distance $d_1$ (first distance) between the first interconnection 24 and the AlGaN layer 6. If the third interconnection 34 is provided on the device isolation region 62, $d_3$ is referred to as a distance between the third interconnection 34 and the device isolation region 62. If the first interconnection 24 is provided on the device isolation region 62, $d_1$ is referred to as a distance between the first interconnection 24 and the device isolation region 62. A film thickness $t_1$ of the first interconnection 24 is larger than a film thickness $t_2$ of the third interconnection 34.

A second interconnection 44 is provided on the AlGaN layer 6 and is electrically connected to the gate electrodes 40. A second connecting portion 42 is provided on the AlGaN layer 6 and electrically connects the gate electrodes 40 to the second interconnection. Here, if plural interconnections electrically connected to the gate electrodes 40 are provided, an interconnection which can describe a largest inscribed circle in a plane parallel to the nitride semiconductor layer is defined as the second interconnection 44. The other interconnections are defined as the second connecting portions 42.

A distance $d_2$ (second distance) between the second interconnection 44 and the AlGaN layer 6 is larger than the distance $d_1$ between the first interconnection 24 and the AlGaN layer 6 and is less than the distance $d_3$ between the third interconnection and the AlGaN layer 6. If the second interconnection 44 is provided on the device isolation region 62, $d_2$ is referred to as a distance between the second interconnection 44 and the device isolation region 62.

A distance $d_4$ between the first connecting portion 22 and the second connecting portion 42 is larger than a distance $d_5$ between the second connecting portion 42 and the AlGaN layer 6 (FIG. 3). If the second connecting portion 42 is provided on the device isolation region 62, $d_5$ is referred to as a distance between the second connecting portion 42 and the device isolation region 62.

A distance $d_6$ between one of the drain electrodes 30 in a plane parallel to the AlGaN layer 6 and the second connecting portion 42 in a plane parallel to the AlGaN layer 6 is larger than a distance $d_7$ between the second connecting portion 42 in a plane parallel to the AlGaN layer 6 and the first interconnection 24 in a plane parallel to the AlGaN layer 6 (FIG. 1).

In order to cause a large current to flow between the source electrodes and the drain electrodes, it is preferable that the area of the first interconnection 24 and the area of the third interconnection 34 in the plane parallel to the AlGaN layer 6 be larger than the area of the second interconnection 44 in the plane parallel to the AlGaN layer 6.

It is preferable that the source electrodes 20 and the drain electrodes 30 have, for example, a stacked structure of titanium (Ti) and aluminum (Al). It is preferable that the gate electrodes 40 be formed of, for example, titanium nitride (TiN). It is preferable that the first connecting portions 22, the second connecting portions 42, and the third connecting portions 32 have, for example, a stacked structure of Ti and Al. It is also preferable that the first interconnection 24, the second interconnection 44, and the third interconnection 34 be formed of, for example, Al, copper (Cu), or gold (Au).

An interlayer insulating film 60 is formed around the source electrodes 20, the first connecting portions 22, the first interconnection 24, the drain electrodes 30, the third connecting portions 32, the third interconnection 34, the gate electrodes 40, the second connecting portions 42, and the interconnection 44. It is preferable that the interlayer insulating film 60 be formed of a polyimide film or a benzocyclobutene (BCB) film, because the specific dielectric constant is small and the substrate-source parasitic capacitance can be reduced.

If the specific dielectric constant of the nitride semiconductor layer is defined as $\epsilon$, the film thickness of the nitride semiconductor layer is defined as $d_0$, the specific dielectric constant of the interlayer insulating film is defined as $\epsilon'$, and the distance between the third interconnection and the AlGaN layer 6 (the nitride semiconductor layer) is defined as $d_3$, it is preferable that the ratio of the specific dielectric constant of the nitride semiconductor layer and the film thickness $d_0$ of the nitride semiconductor layer be larger than the ratio of the specific dielectric constant $\epsilon'$ of the interlayer insulating film and the third distance $d_3$, that is, $(\epsilon/d_0) > (\epsilon'/d_3)$ be established. If the nitride semiconductor layer has a stacked structure of the GaN layer 4 and the AlGaN layer 6 as in this embodiment and if the specific dielectric constant of GaN is defined as $\epsilon_{GaN}$, the film thickness of the GaN layer 4 is defined as $d_{GaN}$, the specific dielectric constant of AlGaN is defined as $\epsilon_{AlGaN}$, and the film thickness of the AlGaN layer 6 is defined as $d_{AlGaN}$, it is preferable that $(\epsilon_{GaN}\epsilon_{AlGaN}/(\epsilon_{GaN}d_{AlGaN}+\epsilon_{AlGaN}d_{GaN})) > (\epsilon'/d_3)$ be established.

Operations and effects of this embodiment will be described below.

Large substrate-source capacitance of a horizontal power-electronics semiconductor device having a multi-finger structure is mainly based on parasitic capacitance between the substrate 2 and the drain electrodes 30, the third connecting portions 32, and the third interconnection 34. Particularly, the third interconnection 34 has a large area and thus greatly contributes to the parasitic capacitance.

The semiconductor device is expected to be applied to high-frequency power semiconductor devices and the like. However, in high-frequency operations, there is a problem in that a switching loss due to charge/discharge to the parasitic capacitance increases, and thus a semiconductor device having high breakdown field strength and high electron mobility cannot be provided.

In the semiconductor device 100 according to this embodiment, the distance $d_3$ between the third interconnection 34 and the AlGaN layer 6 is larger than the distance $d_1$ between the first interconnection 24 and the AlGaN layer 6. Accordingly, it is possible to reduce the parasitic capacitance due to the third interconnection 34.

If the distance $d_3$ between the third interconnection 34 and the AlGaN layer 6 increases, the drain resistance also increases. However, in the semiconductor device 100, the reduction in parasitic capacitance between the third interconnection 34 and the substrate 2 is more preferable than a decrease in drain resistance for the purpose of a high-speed operation. It is preferable that the source electrodes 20 have the same potential as the substrate 2. Accordingly, the parasitic capacitance between the first interconnection 24 and the substrate 2 is less than the parasitic capacitance arising from the third interconnection 34. As a result, the distance $d_1$ between the first interconnection 24 and the substrate 2 may be small.

On the other hand, in order to drive the semiconductor device with a large current, it is preferable that the source resistance decrease. By setting the film thickness $t_1$ of the first interconnection 24 to be larger than the film thickness $t_2$ of the third interconnection 34, it is possible to reduce the source resistance.

The contribution of the parasitic capacitance between the second interconnection 44 and the substrate 2 to the switching loss is not greater than the contribution of the parasitic capacitance between the third interconnection 34 and the substrate 2 thereto, but it is preferable that the parasitic capacitance between the second interconnection 44 and the substrate 2 be reduced. Accordingly, it is preferable that the distance $d_2$ between the second interconnection 44 and the AlGaN layer 6 be larger than the distance $d_1$ between the first interconnection 24 and the AlGaN layer 6 and be less than the distance $d_3$ between the third interconnection and the AlGaN layer 6.

In order to reduce the parasitic capacitance between the second connecting portion 42 and the substrate 2, it is preferable that the distance between the first connecting portion 22 and the second connecting portion 42 be larger than the distance between the second connecting portion 42 and the AlGaN layer 6.

In order to increase the distance between the drain electrodes 30 and the second connecting portion 42 and to increase the withstanding voltage of the semiconductor device 100, it is preferable that the distance $d_6$ between one of the drain electrodes 30 in a plane parallel to the AlGaN layer 6 and the second connecting portion 42 in a plane parallel to the AlGaN layer 6 be larger than the distance $d_7$ between the second connecting portion 42 in a plane parallel to the AlGaN layer 6 and the first interconnection 24 in a plane parallel to the AlGaN layer 6.

$(\epsilon/d_0) > (\epsilon'/d_3)$ is preferable, because it means that the contribution of the parasitic capacitance between the third interconnection 34 and the substrate 2 is less than the contribution of the capacitance due to the nitride semiconductor layer.

According to the semiconductor device according to this embodiment, it is possible to provide a semiconductor device with small parasitic capacitance.

Second Embodiment

A semiconductor device according to this embodiment is different from the semiconductor device according to the first embodiment, in that the third interconnection is not provided right above the drain electrodes. Here, details similar to those in the first embodiment will not be described.

Figure 4:
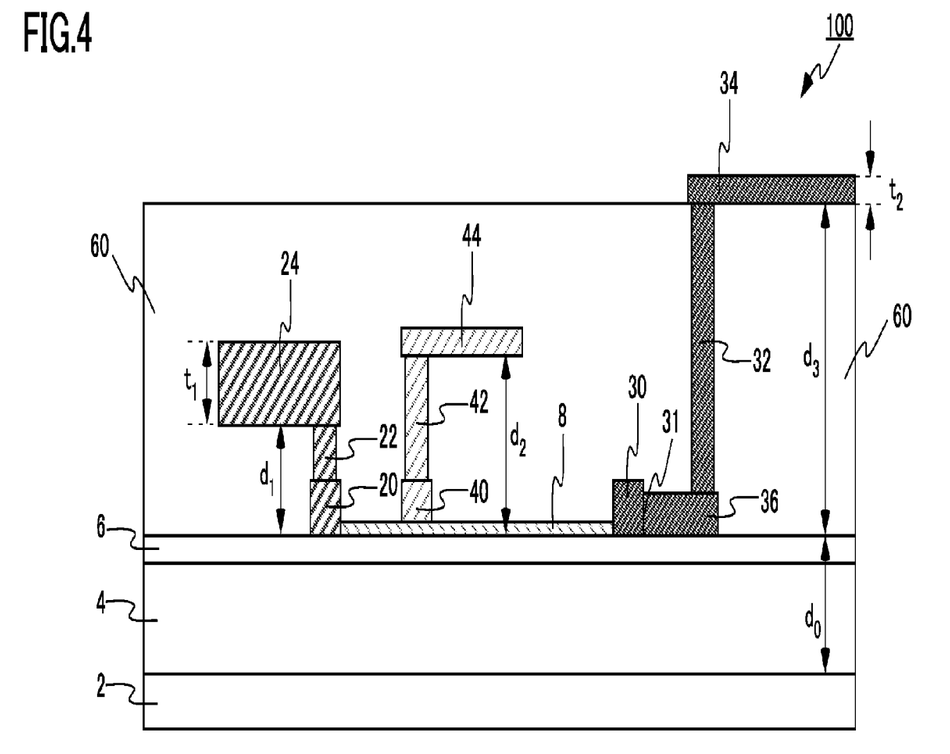
FIG. 4 is a schematic cross-sectional view of a semiconductor device according to a second embodiment.

FIG. 4 is a schematic cross-sectional view of the semiconductor device according to this embodiment.

In the semiconductor device 100 according to this embodiment, a fourth connecting portion 36 is electrically connected to a drain electrode side surface 31. The drain electrode side surface 31 is a side surface of the drain electrodes 30. The third connecting portion 32 is electrically connected to one of the drain electrodes 30 via the fourth connecting portion 36. Accordingly, the third interconnection 34 is not provided right above the drain electrodes 30. As a result, the third interconnection 34 is easily manufactured, which is preferable. The configuration in which the third interconnection 34 is not provided right above the drain electrodes 30 is not limited to this configuration.

According to the semiconductor device according to this embodiment, it is possible to provide a semiconductor device with small parasitic capacitance which can be easily manufactured.

Third Embodiment

A semiconductor device according to this embodiment is different from the semiconductor devices according to the first and second embodiments, in that a device isolation region formed on the nitride semiconductor layer is further provided and the third interconnection is provided right above the device isolation region. Here, details similar to those in the first and second embodiments will not be described.

Figure 5:
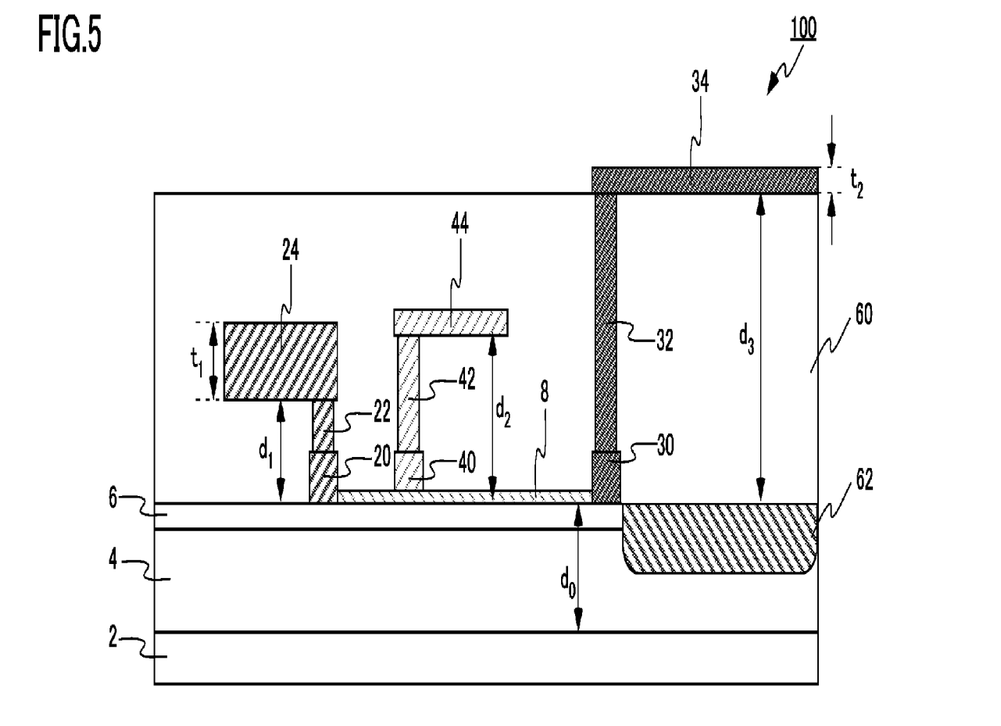
FIG. 5 is a schematic cross-sectional view of a semiconductor device according to a third embodiment.

FIG. 5 is a schematic cross-sectional view of the semiconductor device according to this embodiment.

By providing the third interconnection 34 right above the device isolation region 62, it is possible to increase the withstanding voltage of the semiconductor device 100 and to effectively use the area in an element and it is thus possible to easily decrease the size of the semiconductor device.

According to the semiconductor device according to this embodiment, it is possible to provide a semiconductor device with small parasitic capacitance which can be easily decreased in size.

Fourth Embodiment

A semiconductor device according to this embodiment includes a nitride semiconductor layer; a plurality of source electrodes provided on one surface of the nitride semiconductor layer; a plurality of drain electrodes, each of the drain electrodes provided between the source electrodes; a plurality of gate electrodes, each of the gate electrodes provided between each of the source electrodes and each of the drain electrodes; a first interconnection provided on the opposite surface of the nitride semiconductor layer, the first interconnection having a first distance from the one surface of the nitride semiconductor layer and electrically connected to the source electrodes; a second interconnection provided on the opposite surface of the nitride semiconductor layer, the second interconnection electrically connected to the plurality of gate electrodes; and a third interconnection provided on the one surface of the nitride semiconductor layer, the third interconnection having a third distance from the nitride semiconductor layer and electrically connected to the plurality of drain electrodes, the third distance being larger than the first distance. Here, details similar to those in the first, second, and third embodiments will not be described.

Figure 6:
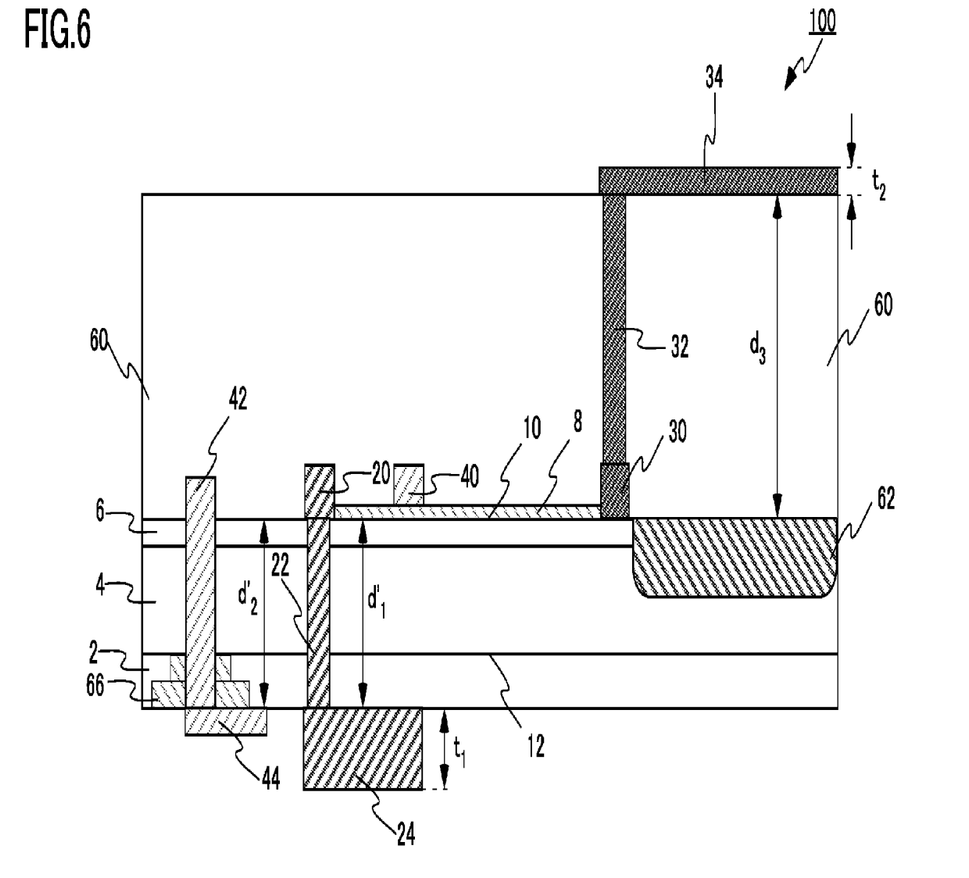
FIG. 6 is a schematic cross-sectional view of a semiconductor device according to a fourth embodiment.

FIG. 6 is a schematic cross-sectional view of the semiconductor device according to this embodiment.

In this embodiment, source electrodes 20, drain electrodes 30, gate electrodes 40, and a third interconnection 34 are provided on one surface 10 of a nitride semiconductor layer (a GaN layer 4 and an AlGaN layer 6). The first interconnection 24 and the second interconnection 44 are provided on the opposite surface 12 of the nitride semiconductor layer. The first interconnection 24 and the second interconnection 44 maybe provided in indirect contact with the opposite surface 12 of the nitride semiconductor layer with another layer such as the substrate 2 or may be provided indirect contact with the opposite surface 12 of the nitride semiconductor layer, as shown in FIG. 6.

The first connecting portions 22 and the second connecting portions 42 penetrate the substrate 2, the GaN layer 4, and the AlGaN layer 6. The first connecting portions 22 electrically connect the source electrodes 20 to the first interconnection 24. The second connecting portions 42 electrically connect the gate electrodes 40 to the second interconnection 44.

The distance $d_3$ (third distance) between the third interconnection 34 and the nitride semiconductor layer (the GaN layer 4 and the AlGaN layer 6) is larger than the distance $d'_1$ (first distance) between the first interconnection 24 and one surface 10 of the nitride semiconductor layer (the GaN layer 4 and the AlGaN layer 6). Accordingly, it is possible to reduce the parasitic capacitance due to the third interconnection 34. If the third interconnection 34 is provided right above the device isolation region 62, $d_3$ is referred to as the distance between the third interconnection 34 and the device isolation region 62.

The semiconductor device according to at least one of the above-mentioned embodiments includes a nitride semiconductor layer; a plurality of source electrodes provided on the nitride semiconductor layer; a plurality of drain electrodes, each of the drain electrodes provided between the source electrodes; a plurality of gate electrodes, each of the gate electrodes provided between each of the source electrodes and each of the drain electrodes; a first interconnection having a first distance from the nitride semiconductor layer and electrically connecting the source electrodes; a second interconnection electrically connecting the gate electrodes; and a third interconnection having a third distance from the nitride semiconductor layer and electrically connecting the drain electrodes, the third distance being larger than the first distance. Accordingly, it is possible to provide a semiconductor device with small parasitic capacitance.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a nitride semiconductor layer;
   a plurality of source electrodes provided on the nitride semiconductor layer;
   a plurality of drain electrodes, each of the drain electrodes provided between the source electrodes;
   a plurality of gate electrodes, each of the gate electrodes provided between each of the source electrodes and each of the drain electrodes;
   a first interconnection having a first distance from the nitride semiconductor layer and electrically connecting the source electrodes;
   a second interconnection electrically connecting the gate electrodes; and
   a third interconnection having a third distance from the nitride semiconductor layer and electrically connecting the drain electrodes, the third distance being larger than the first distance.

2. The device according to claim 1, wherein a film thickness of the first interconnection is larger than a film thickness of the third interconnection.

3. The device according to claim 1, wherein the second interconnection has a second distance from the nitride semiconductor layer, the second distance being larger than the first distance and less than the third distance.

4. The device according to claim 1, further comprising:
   a first connecting portion electrically connecting the source electrodes to the first interconnection; and
   a second connecting portion electrically connecting the gate electrodes to the second interconnection,
   wherein a distance between the first connecting portion and the second connecting portion is larger than a distance between the second connecting portion and the nitride semiconductor layer.

5. The device according to claim 1, wherein a distance between one of the drain electrodes in a plane parallel to the nitride semiconductor layer and the second connecting portion in a plane parallel to the nitride semiconductor layer is larger than a distance between the second connecting portion in the plane parallel to the nitride semiconductor layer and the first interconnection in a plane parallel to the nitride semiconductor layer.

6. The device according to claim 1, further comprising an interlayer insulating film provided between the nitride semiconductor layer and the third interconnection,
   wherein a ratio of a specific dielectric constant of the nitride semiconductor layer and a film thickness of the nitride semiconductor layer is larger than a ratio of a specific dielectric constant of the interlayer insulating film and the third distance.

7. The device according to claim 1, wherein the third interconnection is not provided right above the drain electrodes.

8. The device according to claim 1, further comprising a device isolation region provided on the nitride semiconductor layer,
   wherein the third interconnection is provided right above the device isolation region.

9. The device according to claim 8, wherein the device isolation region is formed of an insulator.

* * * * *